United States Patent
Bjoerk et al.

(10) Patent No.: US 10,066,312 B2
(45) Date of Patent: Sep. 4, 2018

(54) DEVICE FOR PRODUCING A MONO-CRYSTALLINE SHEET OF SEMICONDUCTOR MATERIAL FROM A MOLTEN ALLOY HELD BETWEEN AT LEAST TWO APERTURE ELEMENTS

(71) Applicant: International Business Machines Corporation, Armonk, NY (US)

(72) Inventors: Mikael T. Bjoerk, Rueschlikon (CH);
Heike E. Riel, Rueschlikon (CH);
Heinz Schmid, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/262,138

(22) Filed: Sep. 12, 2016

(65) Prior Publication Data

US 2017/0009372 A1    Jan. 12, 2017

Related U.S. Application Data

(62) Division of application No. 13/698,545, filed as application No. PCT/IB2011/052237 on May 23, 2011, now Pat. No. 9,487,884.

(30) Foreign Application Priority Data

May 31, 2010    (EP) .................................... 10164535

(51) Int. Cl.
*C30B 15/08*    (2006.01)
*C30B 11/10*    (2006.01)
(Continued)

(52) U.S. Cl.
CPC ............ *C30B 15/08* (2013.01); *C30B 11/003* (2013.01); *C30B 11/02* (2013.01); *C30B 11/10* (2013.01);
(Continued)

(58) Field of Classification Search
CPC ..... C30B 15/00; C30B 15/002; C30B 15/007; C30B 15/08; C30B 15/34; C30B 11/00;
(Continued)

(56) References Cited

U.S. PATENT DOCUMENTS 3,160,521 A * 12/1964 Sirtl ........................ C30B 11/12
117/101
4,090,851 A *  5/1978 Berkman ................ C30B 15/08
117/211

(Continued)

FOREIGN PATENT DOCUMENTS

DE       976881    7/1964
DE      3226931    1/1984
(Continued)

OTHER PUBLICATIONS

Examination Report dated Apr. 2, 2013 received for GB application No. GB1221842.6.
(Continued)

*Primary Examiner* — Kenneth A Bratland, Jr.
(74) *Attorney, Agent, or Firm* — Fleit Gibbons Gutman Bongini Bianco PL; Jon A. Gibbons

(57) ABSTRACT

A method for producing a mono-crystalline sheet includes providing at least two aperture elements forming a gap in between; providing a molten alloy including silicon in the gap; providing a gaseous precursor medium comprising silicon in the vicinity of the molten alloy; providing a silicon nucleation crystal in the vicinity of the molten alloy; and bringing in contact said silicon nucleation crystal and the molten alloy. A device for producing a mono-crystalline sheet includes at least two aperture elements at a predetermined distance from each other, thereby forming a gap, and being adapted to be heated for holding a molten alloy including silicon by surface tension in the gap between the aperture elements; a precursor gas supply supplies a gaseous
(Continued)

precursor medium comprising silicon in the vicinity of the molten alloy; and a positioning device for holding and moving a nucleation crystal in the vicinity of the molten alloy.

5 Claims, 4 Drawing Sheets

(51) Int. Cl.

| | | |
|---|---|---|
| *C30B 11/12* | (2006.01) | |
| *C30B 13/18* | (2006.01) | |
| *H01L 31/18* | (2006.01) | |
| *C30B 11/00* | (2006.01) | |
| *C30B 11/02* | (2006.01) | |
| *C30B 15/00* | (2006.01) | |
| *C30B 21/06* | (2006.01) | |
| *C30B 29/06* | (2006.01) | |
| *C30B 29/64* | (2006.01) | |
| *H01L 31/0312* | (2006.01) | |
| *H01L 31/036* | (2006.01) | |

(52) U.S. Cl.
CPC .............. *C30B 11/12* (2013.01); *C30B 13/18* (2013.01); *C30B 15/002* (2013.01); *C30B 21/06* (2013.01); *C30B 29/06* (2013.01); *C30B 29/64* (2013.01); *H01L 31/036* (2013.01); *H01L 31/0312* (2013.01); *H01L 31/1804* (2013.01); *Y02E 10/547* (2013.01); *Y02P 70/521* (2015.11); *Y10T 117/1032* (2015.01)

(58) Field of Classification Search
CPC ....... C30B 11/003; C30B 11/02; C30B 11/10; C30B 11/12; C30B 13/00; C30B 13/16; C30B 13/18; C30B 21/00; C30B 21/06; C30B 25/00; C30B 25/02; C30B 29/00; C30B 29/02; C30B 29/06; C30B 29/60; C30B 29/64; Y10T 117/00; Y10T 117/10; Y10T 117/1024; Y10T 117/1032; Y10T 117/1036; Y10T 117/1092; H01L 31/0312; H01L 31/036; H01L 31/1804; Y02P 70/521; Y02E 10/547
USPC ......... 117/11, 13, 16, 23, 26, 30, 33, 37, 47, 117/73, 77, 81, 84, 88, 200, 206, 117/208–209, 223, 922, 931–932, 935
See application file for complete search history.

(56) References Cited

U.S. PATENT DOCUMENTS

| | | | |
|---|---|---|---|
| 4,099,924 A | | 7/1978 | Berkman et al. |
| 4,108,714 A | | 8/1978 | Keller et al. |
| 4,443,411 A | * | 4/1984 | Kalejs ..................... C30B 15/20 117/211 |
| 4,824,519 A | | 4/1989 | Ostrogorsky |
| 5,229,083 A | | 7/1993 | Bleil |
| 5,367,981 A | * | 11/1994 | Maruyama .............. C30B 13/08 117/200 |
| 6,592,663 B1 | | 7/2003 | Sarayama et al. |
| 2002/0005519 A1 | | 1/2002 | Muramatsu et al. |
| 2002/0129760 A1 | * | 9/2002 | Terao .................... C30B 15/002 117/33 |
| 2008/0168942 A1 | * | 7/2008 | Dehmer .............. H01J 49/0027 117/11 |
| 2009/0297774 A1 | * | 12/2009 | Chaudhari .......... C03C 17/3618 428/149 |
| 2010/0237272 A1 | | 9/2010 | Chaudhari |
| 2011/0033969 A1 | | 2/2011 | Chaudhari |

FOREIGN PATENT DOCUMENTS

| | | |
|---|---|---|
| DE | 19625207 | 3/1997 |
| DE | 102005060391 | 6/2006 |
| FR | 2651249 | 3/1991 |
| GB | 2104410 | 3/1983 |
| JP | 58104093 | 6/1983 |
| JP | 58181794 | 10/1983 |
| JP | 03093691 | 4/1991 |
| JP | 09012394 | 1/1997 |
| JP | 2001064098 | 3/2001 |
| JP | 2005268267 | 9/2005 |
| JP | 2009234906 | 10/2009 |

OTHER PUBLICATIONS

International Search Report and Written Opinion for PCT/IB2011/052237 dated Sep. 12, 2011.
Chaudhari, P. et al., Heteroepitaxial silicon film growth at 600C from an Al-Si eutectic melt, pp. 5368-5371, Jul. 30, 2010, Thin Solid Films, USA.

* cited by examiner

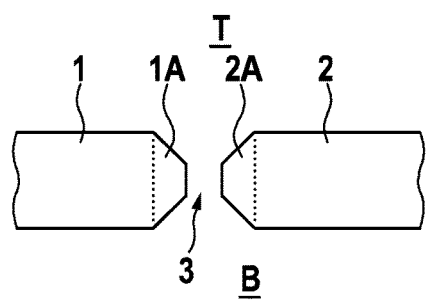
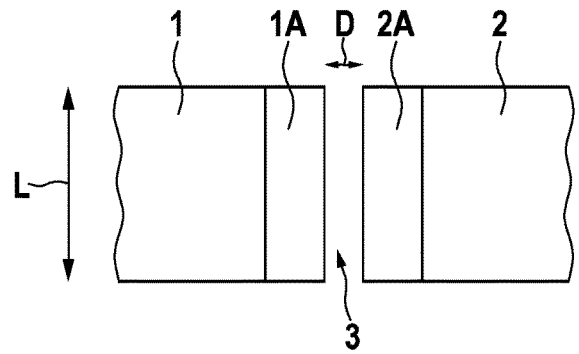
Fig. 2A	Fig. 2B
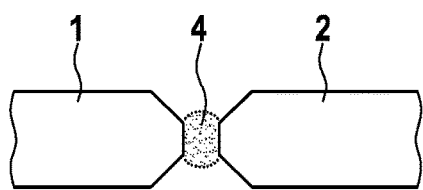
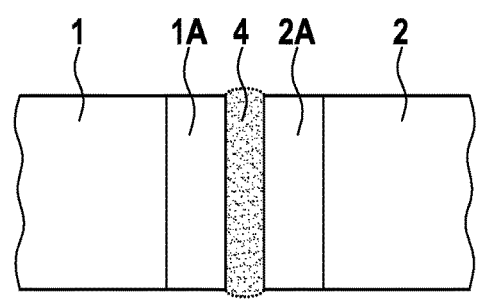
Fig. 3A	Fig. 3B
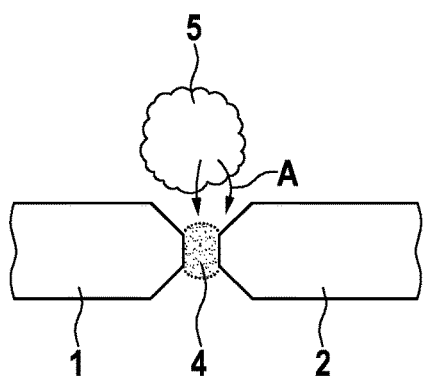
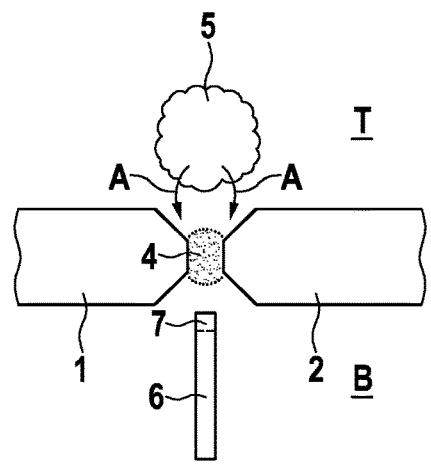
Fig. 4	Fig. 5

DEVICE FOR PRODUCING A MONO-CRYSTALLINE SHEET OF SEMICONDUCTOR MATERIAL FROM A MOLTEN ALLOY HELD BETWEEN AT LEAST TWO APERTURE ELEMENTS

BACKGROUND

This disclosure relates to methods and devices for producing mono-crystalline sheets, in particular to mono-crystalline silicon sheets. Further, a method for producing a solar cell and a solar cell arrangement is presented.

Most semiconductor devices such as integrated circuits or microchips are based on silicon. In addition, silicon can be applied in photovoltaic applications and forms the basis for the majority of solar cells used. For use in solar cell applications thin silicon substrates are extensively used.

It is known that the efficiency of a solar cell based on silicon depends on the crystallinity of the silicon used as substrate. For example, solar cells applying amorphous silicon show efficiencies less than 10%. Higher efficiency solar cells using multi-crystalline silicon may reach efficiencies of around 15%. The efficiency of solar cells is usually measured in terms of the electric power generated by a solar cell per incident solar power. The highest efficiencies for solar cells can be obtained with single crystalline silicon substrates. Also other semiconductor materials, preferably in their single-crystal form, are used in photovoltaic applications. However, in commercial applications predominantly silicon substrates are employed.

SUMMARY

According to an embodiment of an aspect of the invention a method for producing a mono-crystalline sheet of a semiconductor material is presented, said method comprising the steps of:
providing at least two aperture elements forming a gap in-between,
providing a molten alloy comprising said semiconductor material in the gap between said at least two aperture elements,
providing a gaseous precursor medium comprising the semiconductor material in the vicinity of the molten alloy,
providing a nucleation crystal of said semiconductor material in the vicinity of the molten alloy, and
bringing into contact said nucleation crystal and the molten alloy.

According to an embodiment the method may comprise the step of depositing the semiconductor material on the nucleation crystal.

The semiconductor material can be made of, for example, silicon, germanium, indium-arsenide, indium-phosphide, gallium-arsenide, or gallium-phosphide. The precursor medium may include chlorides, hydrides or metal-organic compounds from silicon (Si), germanium (Ge), indium (In), arsenic (As), phosphorus (P) or gallium (Ga) applied as a vapor.

In particular, according to a further embodiment of the invention a method for producing a mono-crystalline silicon sheet is presented, said method comprising the steps of:
providing at least two aperture elements forming a gap in-between,
providing a molten alloy comprising silicon in the gap between said at least two aperture elements,
providing a gaseous precursor medium comprising silicon in the vicinity of the molten alloy,
providing a silicon nucleation crystal in the vicinity of the molten alloy, and
bringing in contact said silicon nucleation crystal and the molten alloy.

By applying the proposed method a mono-crystalline semiconducting sheet may be obtained without the need for cutting a block of a mono-crystal of the semiconductor material into thin sheets. Further, because the mono-crystalline silicon sheet grows along with a nucleation crystal, the sheet may have the form of a rectangle. This geometry may be in particular suitable if used as a substrate for solar cells.

In an embodiment of the method, the step of positioning the aperture elements and the molten alloy such that the molten alloy is held between the aperture elements by surface tension is comprised.

The method may also comprise the step of heating the aperture elements.

In one embodiment, the step of retracting the nucleation crystal gradually from the molten alloy is performed.

For example, by using a gaseous precursor medium comprising silicon the silicon in the precursor medium or precursor gas may enter the molten alloy thereby leading to supersaturation. Then, mono-crystalline silicon may grow on the edge of the nucleation crystal touching the molten alloy region. Consequently, in certain embodiments of the method, silicon may be released from the gaseous precursor medium comprising silicon into the molten alloy, thereby supersaturating the molten alloy with the silicon. Silicon here may stand for any semiconductor material comprised in the precursor medium, or nucleation crystal and the semiconducting material of the mono-crystalline thin sheet to be produced.

According to another embodiment, the method is executed in a protective atmosphere that may comprise an inert gas. Also a vacuum chamber may be used during the process.

According to an embodiment of an aspect of the invention a device for producing a mono-crystalline sheet is provided. The device may comprise at least two aperture elements at a predetermined distance from each other thereby forming a gap and being adapted to be heated for holding a molten alloy comprising a semiconductor material by surface tension in the gap between the aperture elements. The device may include a means for delivering or producing a gaseous precursor medium comprising the semiconductor material in the vicinity of the molten alloy, and a positioning means for holding and moving a nucleation crystal in the vicinity of the molten alloy.

The semiconductor material can be, for example, silicon, germanium, indium- or gallium-arsenide. The precursor medium may include chlorides, hydrides or metal-organic compounds from silicon, germanium, indium or gallium etc. applied as material in a vapor phase.

In particular, a device for producing a mono-crystalline silicon sheet is presented according to an embodiment of the invention. The device comprises at least two aperture elements at a predetermined distance from each other thereby forming a gap and being adapted to be heated for holding a molten alloy comprising silicon by surface tension in the gap between the aperture elements, a means for delivering or producing a gaseous precursor medium comprising silicon in the vicinity of the molten alloy, and a positioning means for holding and moving a nucleation crystal in the vicinity of the molten alloy.

In embodiments of the aspects of the invention, the molten alloy may be a eutectic material, e.g. comprising at least one metal for example gold or aluminium and the semiconductor material.

The gaseous precursor medium may comprise at least one of the group of chlorides, hydrides or metal-organic compounds from at least silicon, germanium, indium, arsenic, phosphorus, nitrogen or gallium.

For silicon, the aperture elements are preferably heated to a temperature between 300° C. and 850° C. Preferably, the method or process steps are performed in a temperature range between 350° C. and 500° C.

In embodiments of the aspects of the invention, the gap between the at least two aperture elements may be an elongated slit.

The two aperture elements may have sections that are v-shaped or grooved. Then, the two oppositely arranged sections may create the gap in between.

The aperture elements may additionally have a silicon oxide ($SiO_2$) coating or carbon coating. The coating may be in particular a dielectric coating comprising a metal oxide.

According to an embodiment of the invention the aperture elements may be formed of silicon.

In one embodiment the predetermined distance between the aperture elements is preferably less than 200 μm.

In a variation of the method, the step of providing a doping gas comprising at least one of the group of silicon (Si), phosphorus (P), boron (B), sulfur (S) arsenic (As) and other doping elements appropriate for the targeted semiconductor as generally known in the art is executed.

In yet another embodiment of the method or the device, the step of providing an etching gas comprising at least one of the group of chlorine (Cl), fluorine (F), bromine (Br) or molecules comprising chlorine (Cl), fluorine (F), or bromine (Br) as a cleaning agent for the aperture elements is performed. Further, said step of providing an etching gas may be used for smoothening or passivating the surface of the resulting semiconductor.

Geometrically, the gaseous precursor medium comprising silicon may be provided on a first side of the aperture elements with respect to the molten alloy, and the silicon nucleation crystal may be provided on a second side of the aperture elements with respect to the molten alloy. For example, the precursor gas or gaseous precursor medium can be arranged above the horizontally arranged aperture elements, and the nucleation crystal can be positioned below the aperture elements.

According to a further embodiment, prior to bringing into contact a silicon nucleation crystal with the molten alloy, the step of cutting the silicon nucleation crystal along the <111> growth direction is performed. This may facilitate the exact growth without any defects in the mono-crystalline silicon sheet.

The grown mono-crystalline silicon sheet, for example, having a rectangular shape may be winded on a roll for further processing.

For example, the silicon sheet can be further processed by masking, doping or metallization steps, surface structuring or placed on a transparent support layer and provided with electric contacts.

According to an embodiment of another aspect of the invention a solar cell arrangement is provided comprising a mono-crystalline sheet produced by the disclosed method for producing a mono-crystalline sheet, the mono-crystalline sheet being doped as to feature a p-n junction.

The solar cell arrangement may be based on a thin mono-crystalline silicon sheet or other semiconductor materials produced through the above depicted fashion.

The silicon sheet may be grown or produced without a substrate or without removing or cutting a silicon layer from a substrate. Rather, the sheet or foil may be grown and produced directly without intermediate layers or substrates.

According to an embodiment of a further aspect, a display is suggested, said display comprising a mono-crystalline sheet produced by the disclosed method for producing a mono-crystalline sheet, the mono-crystalline sheet being doped as to feature a p-n junction.

In particular, the crystalline Si sheet may be used for displays, in particular for large displays driven by crystalline Si transistors. In particular, amorphous Si transistors may be used with less performance, e.g. for organic light-emitting displays.

Certain embodiments or aspects of the device and method may comprise individual or combined features, method steps or aspects as mentioned above or below with respect to exemplary embodiments.

In the following exemplary embodiments of method and device for producing mono-crystalline sheets, and solar cell arrangements are described with reference to the enclosed figures.

BRIEF DESCRIPTION OF THE DRAWINGS

FIGS. 2A, 2B, 3A, 3B, 4, 5, 6, and 7 show illustrations of method steps and device arrangements for implementing an embodiment of a method for producing a mono-crystalline silicon sheet;

DETAILED DESCRIPTION

Figure 1:
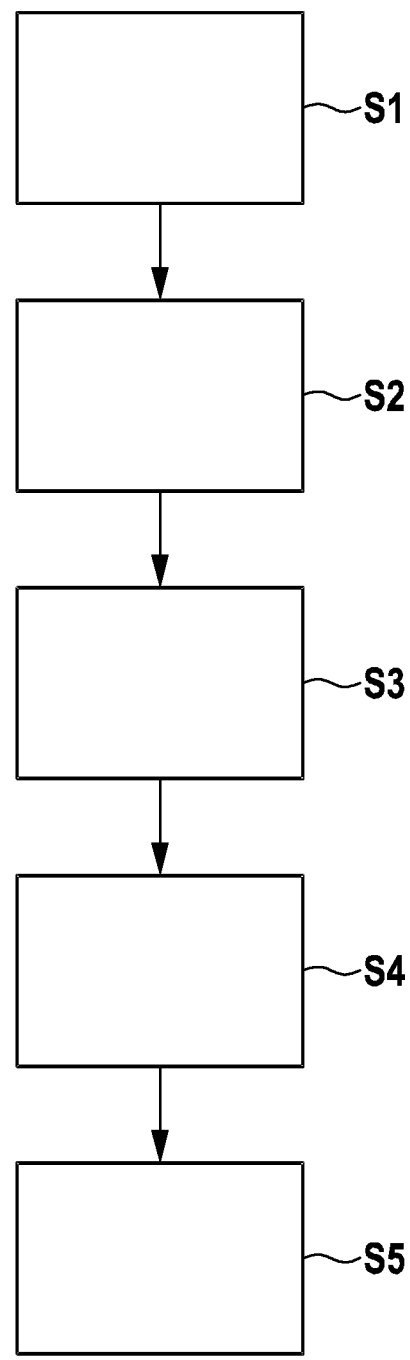
FIG. 1 shows a block flow diagram of an embodiment of a method for producing a mono-crystalline silicon sheet.

Like or functionally like elements in the drawings have been allotted the same reference characters if not otherwise indicated.

As used herein, "bringing into contact" may refer to the act of touching, making contact or immediate proximity, in particular between the nucleation crystal and the molten alloy. Bringing into contact comprises the relative movement of the elements towards each other to be brought into contact.

As used herein, "molten" may refer to a substance that is melted, wherein melting is the process of heating a solid substance to the melting point where it turns into a liquid. Molten alloy may therefore imply that an appropriate temperature for creating the liquid phase of the alloy is chosen and applied.

An "alloy" may refer to a homogeneous mixture of two or more elements, at least one of which is a metal. As for example, a gold silicon alloy can be employed according to an aspect of a method or device for producing a mono-crystalline silicon sheet.

The term "eutectic" means that the alloy comprising a combination of materials melts at a temperature lower than that of the melting temperature of either of its components.

Gold-silicon eutectic alloy may melt at about 700° C. lower than either of its components, at about 360° C.

As used herein the "gap" may also be called an aperture, slot, trench or vent. The gap may be a space between two aperture elements, wherein a width of the aperture is smaller than the length of the aperture. Preferably, a ratio between the length and the width is at least two, wherein the width corresponds to a distance between the aperture elements. The gap can be implemented as a slit.

The term "mono-crystalline silicon sheet" corresponds to mono-crystalline silicon without a supporting substrate. The sheet may also be called a silicon film, layer, membrane or foil.

The term "mono-crystalline" may refer to a solid material wherein the crystal lattice of the entire sheet is continuous and unbroken to the edges of the sheet. The produced mono-crystalline sheet is in contrast to amorphous materials where there is no long-range order of the positions of the material atoms. Typically amorphous phases are produced by depositing a layer of the material on a substrate. Mono-crystalline materials may have advantages over poly-crystalline materials that are composed of many crystallites or grains of varying size and orientation. Solar cells based on amorphous silicon substrates (aSi) may show efficiencies in terms of produced electricity per solar power unit of less than 10%, based on multi- or poly-crystalline silicon (mc- or poly-Si) show around 15% efficiency, and solar cells employing single- or mono-crystalline silicon (c-Si) may arrive at 22% efficiency.

Referring now to FIG. 1 showing a block flow diagram of one embodiment of a method for producing a mono-crystalline silicon sheet, and referring to FIGS. 2-7 illustrating potential method steps certain aspects of such a method for producing silicon sheets are explained. In particular, FIGS. 2-7 also show schematically features and elements of an apparatus or a device suitable for performing a method for producing a mono-crystalline silicon sheet.

In a first method step S1, as shown in FIG. 1, two aperture elements as shown in FIG. 2A and FIG. 2B are provided. The aperture elements 1, 2 may each have a section 1A, 2A, having a groove-like or v-like shape. The two groove-like sections 1A and 2A are arranged oppositely from each other such that between the two aperture elements 1, 2 a gap 3 occurs. FIG. 2A shows a cross-sectional view, wherein in the orientation of FIG. 2A a top side T and a bottom side B is defined by the two horizontally arranged aperture elements 1, 2.

FIG. 2B shows a top view of the two aperture elements 1, 2. The two aperture elements are arranged at a predetermined distance D. The gap 3, as can be seen from the top view in FIG. 2B, has the form of an elongated slit of a length L. Preferably, the length L exceeds the distance D significantly. For example, the aperture or gap width D can be defined by a distance D smaller than 200 μm. However, in certain embodiments, the length of the slit or gap 3 may be 10 cm or longer. The slit or gap 3 may be straight, i.e. the two groove-like aperture sections 1A, 2A are arranged in a parallel fashion. The aperture elements are preferably micromachined from silicon and can be coated by silicon dioxide or carbon. However, other materials as a protective cover can be contemplated.

In the next step S2 a molten alloy comprising silicon is placed into the space of the gap 3 between the two aperture elements 1, 2. FIGS. 3A and 3B show, for example, a molten alloy 4 fitting into the gap along the length of the aperture or gap. The alloy, for example comprising a gold-silicon (Au—Si) alloy is eutectic and has a temperature of about 360° C. This is illustrated as the dotted area 4.

In the next process step S3, a precursor medium in its gaseous phase is brought to the vicinity of the molten alloy 4. This is shown in FIG. 4. The precursor medium or precursor gas is shown as a schematic cloud 5. For example, a gas supply device supplies silicon chloride $SiCl_4$ or silane $SiH_4$ or another metal-organic compound from silicon to the molten alloy 4. The precursor containing silicon releases silicon into the gold-silicon alloy which is illustrated by the arrows A. After a while the alloy 4 becomes supersaturated.

The temperature of the aperture and the precursor gas is chosen according to the used precursor material and alloy material. Temperatures may be arranged between 350° C. and 850° C. However, also higher temperatures, for example if silicon chloride is used, may be employed.

Next, in step S4, as illustrated in FIG. 5, a mono-crystalline silicon crystal employed as a nucleation crystal 6, is brought from below into the vicinity of the molten supersaturated alloy 4. FIG. 5 illustrates the nucleation crystal 6, which is preferably cut along the <111> growth direction and positioned with its tip 7 close to the molten alloy with supersaturated silicon.

Figure 6:
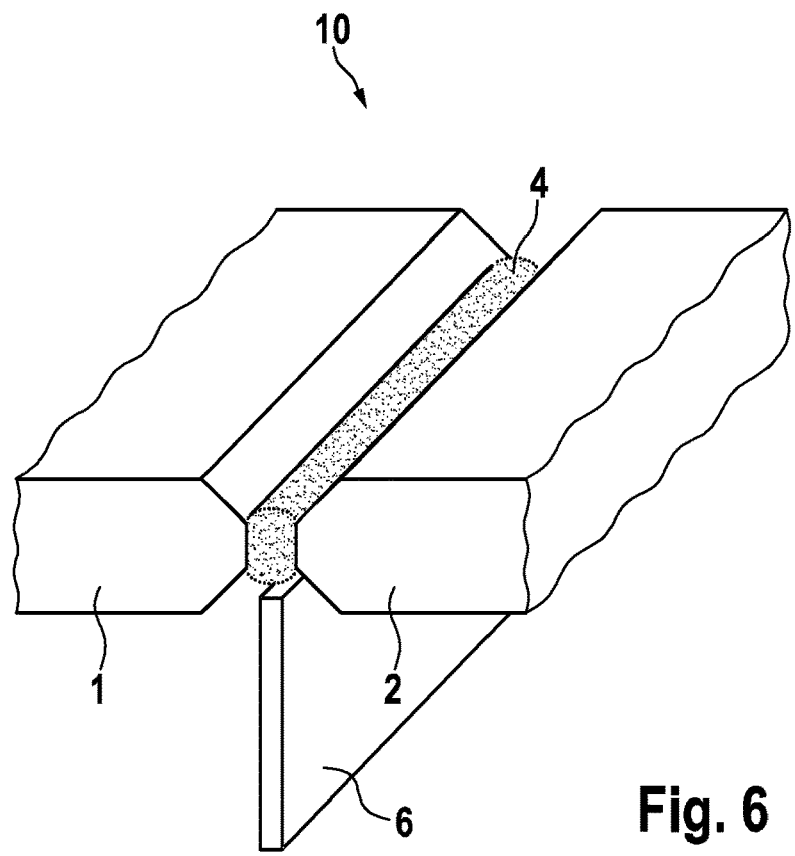

FIG. 6 shows a perspective view of the two elongated aperture elements forming an elongated slit or gap in between where the molten alloy 4 is situated. This molten alloy 4 may be held between the two aperture elements 1, 2 by surface tension only. Below the horizontal arrangement of the first aperture element 1, the molten alloy 4 in the gap and the second aperture element 2, the nucleation crystal 6 made of silicon is positioned. The arrangement as shown in FIG. 6 corresponds to one embodiment of a device or apparatus for producing mono-crystalline silicon sheets.

Figure 7:
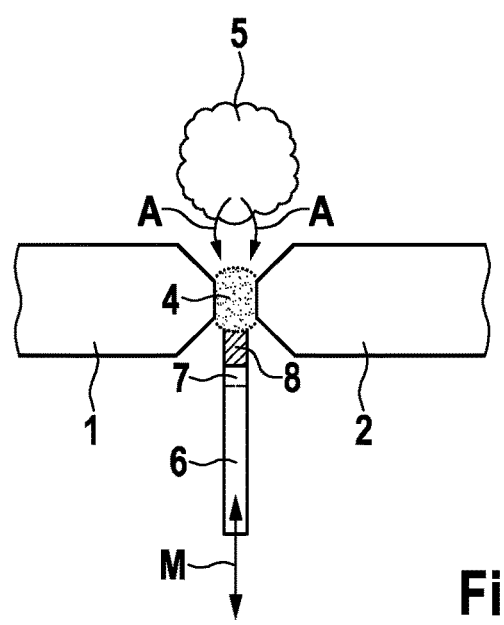

As the nucleation crystal is brought into contact with the supersaturated molten alloy (step S4), which is shown in FIG. 7, a mono-crystalline silicon sheet evolves. As the molten alloy, for example comprising an eutectic mixture of gold and silicon, continuously remains supersaturated by the influence of the precursor gas 5, silicon 8 crystallizes at the tip 7 of the nucleation crystal 6 being in close proximity to the molten alloy 4. One may continuously retract the nucleation crystal 6 with the growing mono-crystalline sheet 8 as indicated by the arrow M in FIG. 7. The retraction speed of the nucleation crystal from the alloy 4 is adapted to the growth rate of the sheet 8. During the fabrication process the supersaturated alloy continuously dissolves silicon onto the nucleation crystal. The speed can be controlled as to guarantee a constant shape or cross-sectional shape of the molten alloy material 4 between the aperture elements 1, 2. The retracting step S5 can be controlled by a control device like a microprocessor or appropriately programmed computer controlling the entire device for producing the mono-crystalline silicon layer.

The growth rate or retraction speed of the grown mono-crystalline silicon sheet may vary according to preferred embodiments of the invention between 0.1 mm-3 mm per minute. However, also higher growth rates may be obtained.

Figure 8:
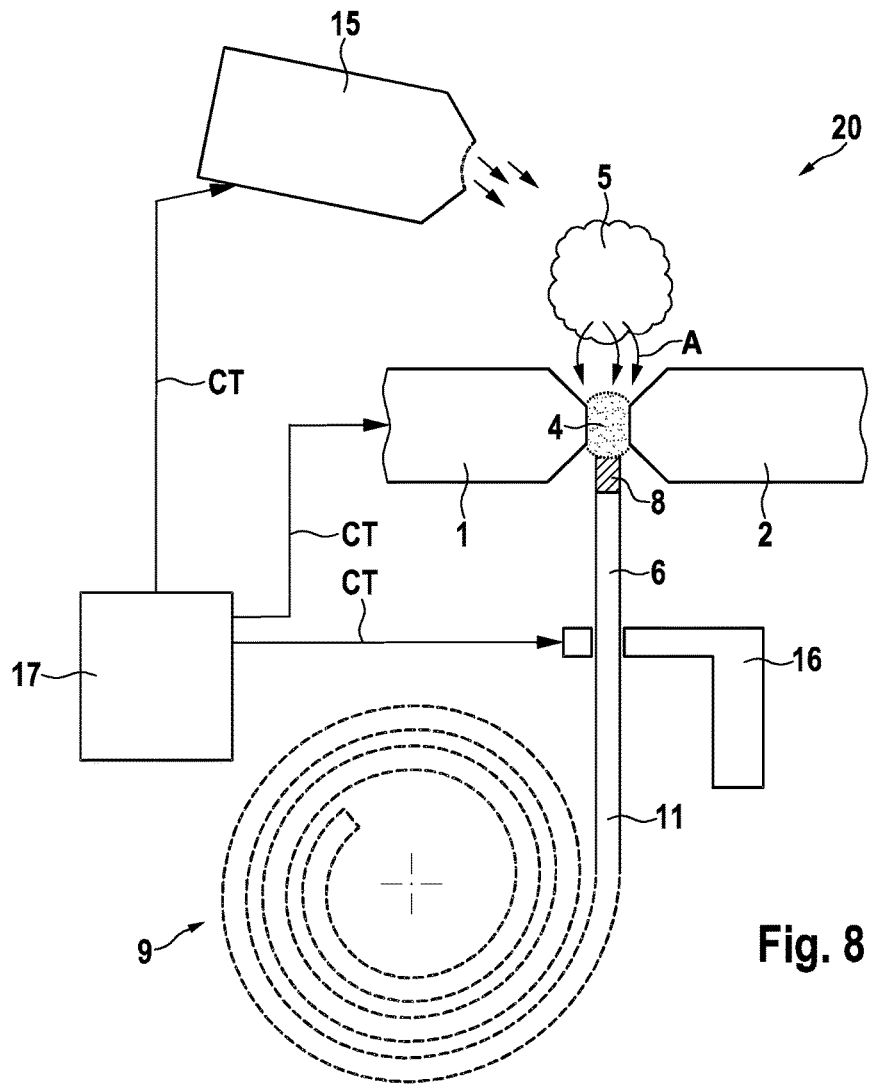
FIG. 8 shows a schematic drawing of an embodiment of a device for producing a mono-crystalline silicon sheet.

FIG. 8 shows another embodiment of a device for producing mono-crystalline silicon sheets and thereby implementing another embodiment of the before depicted method. FIG. 8 shows the production device 20 having two aperture elements forming a gap in between that is suitable to be heated such that a molten alloy 4 is retained between the aperture elements by surface tension. A precursor gas supply 15, also denoted as means for delivering a gaseous precursor medium, provides a precursor medium 5 comprising silicon. By appropriately adapting the temperature of the molten alloy, as for example gold and silicon, and of the precursor medium 5, the alloy 4 becomes supersaturated by silicon. This is indicated by the arrows A.

Further, a positioning or pulling device 16, also denoted as positioning means, holds the nucleation crystal 6 and gradually retracts the continuously growing mono-crystalline sheet in the growth region 8 from the molten alloy 4. For example, the grown mono-crystalline silicon sheet 11 can be winded on a roll 9 for further processing.

The embodiment of a device 20 for fabricating or producing a mono-crystalline silicon thin sheet also comprises a control device 17 producing appropriate control signals CT to the precursor gas supply 15, the heated aperture elements 1, 2 and the positioning device 16. The entire arrangement 20 can be capped in a protective atmosphere using an inert gas as for example argon.

One may also contemplate of adding doping gases into the process for doping the semiconductor sheet during its growth. For example silicon, phosphor, boron or carbon can be used as doping materials. One may further contemplate of adding etching gases as cleaning agents for the aperture elements. Appropriate etching gases may comprise molecules containing chlorine, fluorine or bromine. As mentioned before, the aperture elements 1, 2 can be made from silicon, and coated by an oxide layer or carbon.

Figures 9, 10:
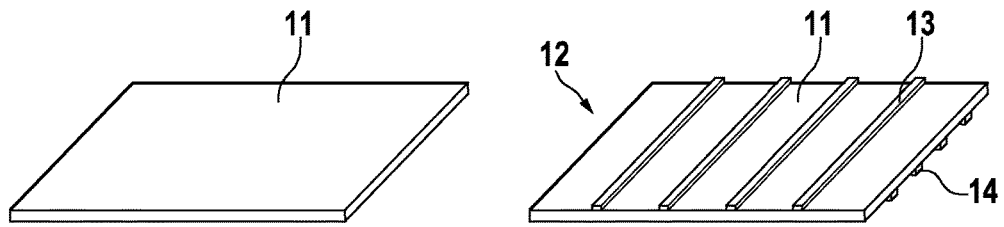
FIG. 9 shows a schematic drawing of a mono-crystalline silicon sheet.
FIG. 10 shows a schematic drawing of an embodiment of a solar cell based on a mono-crystalline silicon sheet.

Due to the geometric implementation of the parallel aperture elements, thereby realizing an elongated slit or gap, rectangular shapes of the silicon sheet that may be rolled for further processing are obtained. FIG. 9 shows a schematic illustration of such a mono-crystalline silicon sheet produced by the presented method or device.

The single crystalline sheet material of silicon may be applied for realizing solar cells. In particular, single crystalline materials may allow for a higher performance or efficiencies in photovoltaic applications. Since the thin sheets may be directly fabricated no small material waste occurs due to conventionally necessary sawing or cutting. This may result in reduced material and process costs. The entire process may occur at relatively low temperatures. This may provide for an energy efficient production method.

FIG. 10 shows an exemplary embodiment of a solar cell comprising a thin mono-crystalline silicon sheet produced for example according to the method explained with respect of FIGS. 1-7. The silicon sheet is doped as to provide for a p-n junction across its thickness. The solar cell 12 comprises the doped silicon sheet 11 with electric contacts 13 on the top side and additional contacts 14 on the bottom side. Such solar cells may be employed in solar panels or photovoltaic modules comprising a plurality of such solar cells used to generate electricity.

Although the proposed method and device is explained in terms of embodiments for mono-crystalline silicon sheet production, also other mono-crystalline semiconductor sheets can be produced. For example, instead of a gold silicon alloy, metallic alloys comprising germanium, indium or gallium can be used as an alloy. Then, appropriate precursor gases containing germanium, indium or gallium would be employed instead of a silicon-based precursor medium.

For realizing alternative solar cell arrangements the silicon foil may be placed onto a transparent support or substrate and provided with wiring. Further to photovoltaic applications the thin mono-crystalline silicon film may be used in all other electronic devices that employ semiconducting substrates, as for example sensors, nano-technological systems, displays and the like.

What we claim is:

1. A device for producing a mono-crystalline semiconductor sheet comprising:
    at least two horizontal aperture elements with a length greater than a thickness and the length oriented in a plane parallel to earth, and disposed by a distance from each other thereby forming a gap, and
        the at least two horizontal aperture elements being adapted to be heated, and
        the at least two horizontal aperture elements adapted to hold, below the gap by surface tension in the gap, a molten alloy comprising a mixture of two or more elements one of which is a metal;
    a precursor gas supply for delivering a gaseous precursor medium comprising silicon in the vicinity of the molten alloy; and
    a positioning device for holding and moving a nucleation crystal below of the molten alloy that is continuously growing below the molten alloy.

2. The device of claim 1, wherein the two horizontal aperture elements have end sections opposite each other forming boundaries of the gap whose cross-sectional shape is a truncated v-shaped.

3. The device of claim 2, wherein the two horizontal aperture elements have a coating comprising one of metal oxides and a carbon coating.

4. The device of claim 3, wherein the distance is less than 200 micrometers.

5. The device of claim 4, wherein the device is adapted to:
    produce a mono-crystalline sheet of a semiconductor material comprising
        provide at least two horizontal aperture elements forming a gap in between;
        provide a molten alloy comprising the semiconductor material in the gap between the at least two horizontal aperture elements, whereby the molten alloy is held between the at least two horizontal aperture elements by surface tension;
        provide a gaseous precursor medium delivering the semiconductor material in the vicinity of the molten alloy;
        provide a nucleation crystal in the vicinity of the molten alloy; and
        bring in contact said nucleation crystal and the molten alloy.

* * * * *